United States Patent
Yanagitani et al.

(10) Patent No.: US 10,763,816 B2
(45) Date of Patent: Sep. 1, 2020

(54) PIEZOELECTRIC LAYER AND PIEZOELECTRIC DEVICE COMPRISING THE PIEZOELECTRIC LAYER

(71) Applicant: AVAGO TECHNOLOGIES INTERNATIONAL SALES PTE. LIMITED, Singapore (SG)

(72) Inventors: Takahiko Yanagitani, Tokyo (JP); Masashi Suzuki, Tokyo (JP)

(73) Assignee: Avago Technologies International Sales PTE. Limited, Singapore (SG)

( * ) Notice: Subject to any disclaimer, the term of this patent is extended or adjusted under 35 U.S.C. 154(b) by 0 days.

(21) Appl. No.: 16/087,749

(22) PCT Filed: Mar. 30, 2017

(86) PCT No.: PCT/IB2017/000451
§ 371 (c)(1),
(2) Date: Sep. 24, 2018

(87) PCT Pub. No.: WO2017/191499
PCT Pub. Date: Nov. 9, 2017

(65) Prior Publication Data
US 2019/0089325 A1 Mar. 21, 2019

(30) Foreign Application Priority Data
May 6, 2016 (JP) .................. 2016-092976

(51) Int. Cl.
*H03H 9/02* (2006.01)
*H03H 9/64* (2006.01)
(Continued)

(52) U.S. Cl.
CPC ....... *H03H 9/02015* (2013.01); *C01B 21/072* (2013.01); *C23C 14/0617* (2013.01);
(Continued)

(58) Field of Classification Search
CPC .. H03H 9/02031; H03H 9/02015; H03H 9/64; H03H 9/566; H03H 9/562;
(Continued)

(56) References Cited

U.S. PATENT DOCUMENTS 9,243,316 B2 1/2016 Larson, III et al.
2006/0255884 A1* 11/2006 Tanaka ............... H03H 9/02551
333/195
(Continued)

FOREIGN PATENT DOCUMENTS

JP 2009010926 A 1/2009

OTHER PUBLICATIONS

C. Wingqvist, "AlN-based sputter-deposited shear mode thin film bulk acoustic resonator (FBAR) for biosensor applications—A review", Surface & Coating Technology, 205, 2010, pp. 1279-1286.
(Continued)

*Primary Examiner* — Rakesh B Patel
*Assistant Examiner* — Jorge L Salazar, Jr.
(74) *Attorney, Agent, or Firm* — Foley & Lardner LLP

(57) ABSTRACT

A piezoelectric material is described. The piezoelectric material comprises aluminum nitride (AlN) doped with ytterbium (Yb), an atomic percentage of Yb in the AlN being greater than or equal to approximately 10.0% and less than or equal to approximately 27.0%. Piezoelectric layers comprising the piezoelectric material may be used in bulk
(Continued)

acoustic wave (BAW) acoustic resonators, and surface acoustic wave (SAW) acoustic resonators. The BAW acoustic resonators and SAW acoustic resonators can be used in a variety of applications.

20 Claims, 9 Drawing Sheets

(51) Int. Cl.
   *C01B 21/072*  (2006.01)
   *C23C 14/06*  (2006.01)
   *C23C 14/34*  (2006.01)
   *H01L 41/187*  (2006.01)
   *H01L 41/316*  (2013.01)
   *H03H 9/13*  (2006.01)
   *H03H 9/145*  (2006.01)
   *H03H 9/17*  (2006.01)
   *H03H 9/25*  (2006.01)
   *H03H 9/56*  (2006.01)

(52) U.S. Cl.
  CPC ............ *C23C 14/34* (2013.01); *H01L 41/187* (2013.01); *H01L 41/316* (2013.01); *H03H 9/02031* (2013.01); *H03H 9/02543* (2013.01); *H03H 9/13* (2013.01); *H03H 9/145* (2013.01); *H03H 9/175* (2013.01); *H03H 9/176* (2013.01); *H03H 9/25* (2013.01); *H03H 9/562* (2013.01); *H03H 9/566* (2013.01); *H03H 9/64* (2013.01); *C01P 2002/54* (2013.01); *C01P 2002/77* (2013.01); *C01P 2006/40* (2013.01)

(58) Field of Classification Search
  CPC .......... H03H 9/25; H03H 9/176; H03H 9/175; H03H 9/145; H03H 9/13; H03H 9/02543; H01L 41/316; H01L 41/187; C23C 14/34; C23C 14/0617; C01B 21/072; C01P 2006/40; C01P 2002/77; C01P 2002/54

USPC .......................... 333/133, 187, 188, 193–196
See application file for complete search history.

(56) References Cited

U.S. PATENT DOCUMENTS

| | | | |
|---|---|---|---|
| 2011/0316649 A1* | 12/2011 | Link | H03H 9/566 333/133 |
| 2015/0084719 A1 | 3/2015 | Umeda | |
| 2015/0244346 A1 | 8/2015 | Feng et al. | |
| 2015/0311046 A1 | 10/2015 | Yeh et al. | |

OTHER PUBLICATIONS

Milena Moreira, "Aluminum scandium nitride thin-film bulk acoustic resonators for wide band applications", Vacuum, 86, 2011, pp. 23-26.

Stephan Barth et al., "Effect of process parameters on structure and piezoelectric properties of AlN and AlXSc1-XN films deposited by pulsed magnetron sputtering", 2014 IEEE International Ultrasonics Symposium Proceedings, pp. 769-772.

Ramin Matioub et al., "Electromechanical properties of Al0.9Sc0.1N thin films evaluated 2.5GHz film bulk acoustic resonators", Appies Physics Letters 99, (2011), pp. 092903-1 to 092903-3.

Rajan S. Naik et al., "Measurements of the Bulk, C-Axis Electromechanical Coupling Constant as a Function of AlN Film Quality", IEEE Transactions on Ultrasonics, Ferroelectrics, and Frequency Control, vol. 47, No. 1, Jan. 2000, pp. 292-296.

Takahiko Yanagitani et al., "Electromechanical coupling and gigahertz elastic properties of ScAlN films near phase boundary", Applied Physics Letters, 105, 122907, Sep. 2014, pp. 1-6.

Takahiko Yanagitani et al., "Enhanced piezoelectricity in YbGaN films near phase boundary", Applied Physics Letters, 104, 082911, Feb. 2014, pp. 1-6.

M. A. Moreira et al., "Synthesis and characterization of highly c-textured Al(1-x)Sc(x)N thin films in view of telecom applications", I O P Conference Series: Materials Science and Engineering, vol. 41, Dec. 6, 2012.

International Search Report dated Aug. 21, 2017, International App. No. PCT/IB2017/000451, 15 pgs.

* cited by examiner

PIEZOELECTRIC LAYER AND PIEZOELECTRIC DEVICE COMPRISING THE PIEZOELECTRIC LAYER

CROSS-REFERENCE TO RELATED APPLICATIONS

This application is a National Stage Filing under 35 U.S.C. § 371 from International Patent Application No. PCT/IB2017/000451 filed on Mar. 30, 2017, which claims priority under 35 U.S.C. § 365 from Japanese Patent Application No. 2016-92976 filed on May 6, 2016, and names Yanagitani as the inventor. The present application claims priority under 35 U.S.C. § 119(e) from International Patent Application No. PCT/IB2017/000451, and from Japanese Patent Application No. 2016-92976. The entire disclosures of Japanese Patent Application No. 2016-92976 and International Patent Application No. PCT/IB2017/000451 are specifically incorporated herein by reference.

BACKGROUND

In many electronic applications, electrical resonators are used. For example, in many wireless communications devices, radio frequency (rf) and microwave frequency resonators are used as filters to improve reception and transmission of signals. Filters typically include inductors and capacitors, and more recently resonators.

As will be appreciated, it is desirable to reduce the size of components of electronic devices. Many known filter technologies present a barrier to overall system miniaturization. With the need to reduce component size, a class of resonators based on the piezoelectric effect has emerged. In piezoelectric-based resonators, acoustic resonant modes are generated in the piezoelectric material. These acoustic waves are converted into electrical waves for use in electrical applications.

Acoustic resonators convert electrical signals to acoustic signals (sound waves) and convert received acoustic waves to electrical signals via inverse and direct piezoelectric effect. Acoustic transducers generally include acoustic resonators, such as surface acoustic wave (SAW) resonators and bulk acoustic wave (BAW) resonators, and may be used in a wide variety of electronic applications, such as cellular telephones, personal digital assistants (PDAs), electronic gaming devices, laptop computers and other portable communications devices. For example, BAW resonators include layer bulk acoustic resonators (FBARs), which include resonator stacks formed over a substrate cavity, and solidly mounted resonators (SMRs), which include resonator stacks formed over an acoustic reflector (e.g., Bragg mirror). The BAW resonators may be used for electrical filters and voltage transformers, for example.

Generally, an acoustic resonator has a layer of piezoelectric material between two conductive plates (electrodes), which may be formed on a thin membrane. The piezoelectric material may be a layer of various materials, such as aluminum nitride (AlN), zinc oxide (ZnO), or lead zirconate titanate (PZT), for example.

One of the indicators of a characteristic of the piezoelectric layer is an electromechanical coupling coefficient ($kt^2$). The electromechanical coupling coefficient is a coefficient indicating the efficiency of conversion between electric energy and mechanical vibration energy. In a frequency filter using a piezoelectric layer, the larger the electromechanical coupling coefficient of a piezoelectric material is, the wider the frequency is the bandwidth of the filter.

While various methods to increase the bandwidth of a filter comprising acoustic resonators have been investigated, there is an ongoing need to improve the bandwidth by increasing the electromechanical coupling coefficient of the piezoelectric material used in the acoustic resonator.

What is needed, therefore, is a BAW resonator that overcomes at least the known shortcomings described above.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
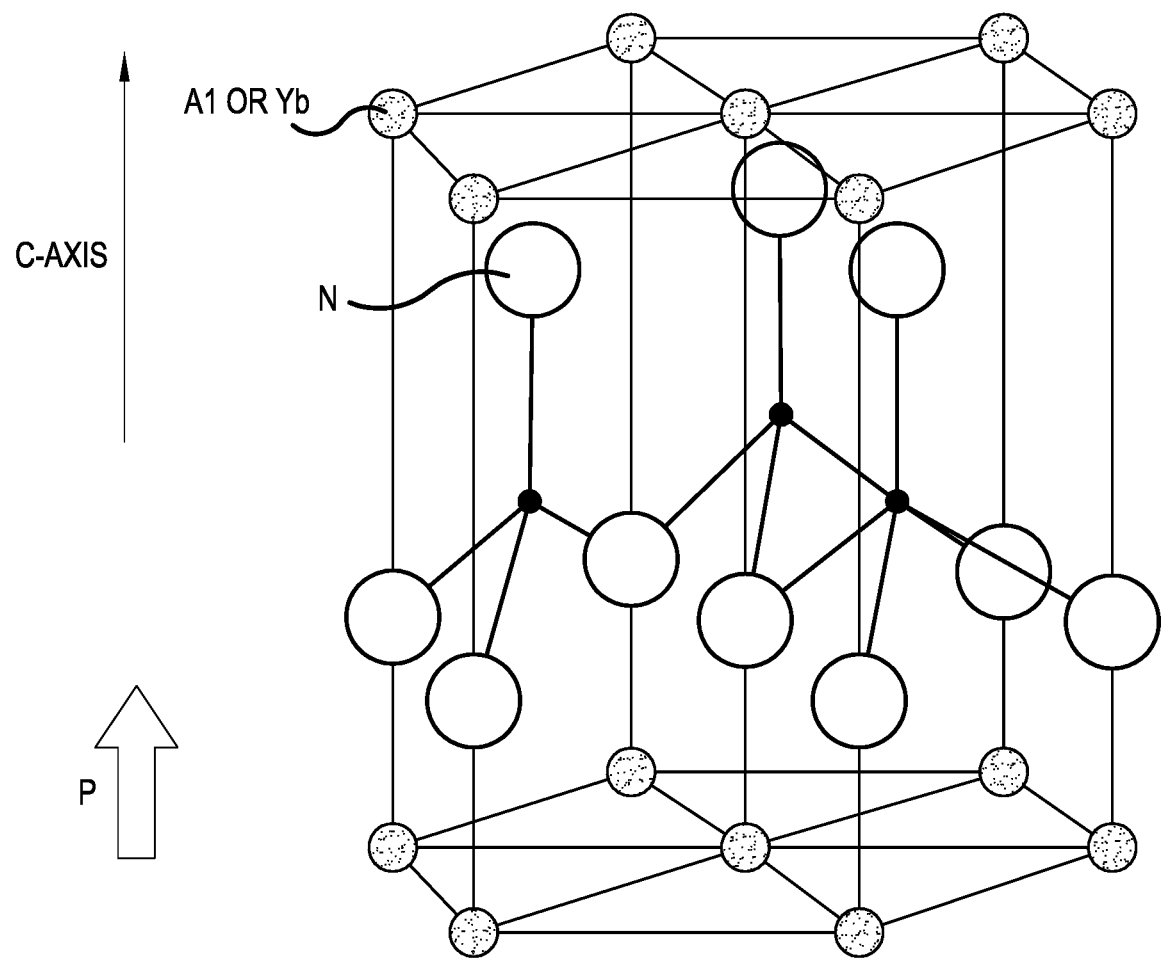
FIG. 1 is a schematic view of the crystal structure of Al1-xYbxN inb accordance with a representative embodiment.

In the following detailed description, for purposes of explanation and not limitation, example embodiments disclosing specific details are set forth in order to provide a thorough understanding of the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be "below" that element. Similarly, if the device were rotated by 90° with respect to the view in the drawings, an element described "above" or "below" another element would now be "adjacent" to the other element; where "adjacent" means either abutting the other element, or having one or more layers, materials, structures, etc., between the elements.

In accordance with the present teachings, and as described in more detail below, a piezoelectric layer has an improved or increased electromechanical coupling coefficient ($kt^2$) compared to known piezoelectric materials. The improved/increased electromechanical coupling coefficient ($kt^2$) beneficially provides apparatuses (e.g., bulk acoustic wave (BAW) and surface acoustic wave (SAW) resonators and filters) having a greater usable frequency bandwidth compared to known filters.

A variety of devices, structures thereof, materials and methods of fabrication are contemplated for the acoustic resonators of the apparatuses of the present teachings. Various details of such devices and corresponding methods of fabrication may be found, for example, in one or more of the following U.S. patent publications: U.S. Pat. No. 6,107,721 to Lakin; U.S. Pat. Nos. 5,587,620, 5,873,153, 6,507,983, 7,388,454, 7,714,684, and 8,436,516 to Ruby et al.; U.S. Pat. Nos. 7,369,013, 7,791,434, and 8,230,562 to Fazzio, et al.; U.S. Pat. Nos. 8,188,810, 7,280,007, and 9,455,681 to Feng et al.; U.S. Pat. Nos. 8,248,185, and 8,902,023 to Choy, et al.; U.S. Pat. No. 7,345,410 to Grannen, et al.; U.S. Pat. No. 6,828,713 to Bradley, et al.; U.S. Pat. Nos. 7,561,009, 7,358,831, and 9,243,316 to Larson, III et al.; U.S. Pat. No. 9,197,185 to Zou, et al., U.S. Patent Application Publication No. 20120326807 to Choy, et al.; U.S. Pat. No. 7,629,865 to Ruby; U.S. Patent Application Publication Nos. 20110180391 and 20120177816 to Larson III, et al.; U.S. Patent Application Publications Nos. 20140246305 and 20140132117 to Larson III; U.S. Patent Application Publication No. 20070205850 to Jamneala et al.; U.S. Patent Application Publication No. 20110266925 to Ruby, et al.; U.S. Patent Application Publication No. 20130015747 to Ruby, et al.; U.S. Patent Application Publication No. 20130049545 to Zou, et al.; U.S. Patent Application Publication No. 20140225682 to Burak, et al.; U.S. Patent Application Publication Nos.: 20140118090, 20140354109, and 20150326200 to Grannen, et al.; U.S. Patent Application Publication Nos. 20140292150 and 20140175950 to Zou, et al.; U.S. Patent Application Publication No. 20150244347 to Feng, et al.; U.S. Patent Application Publication 20150311046 to Yeh, et al.; and U.S. Patent Application Publication No. 20150207489 to Bi, et al. The entire disclosure of each of the patents and patent application publications listed above is hereby specifically incorporated by reference herein. Notably, variations of the teachings of some of the patents and patent application publications may be effected to include ytterbium (Yb)-doped AlN to achieve the desired piezoelectric layer of the present teachings described below. It is emphasized that the components, materials and methods of fabrication described in these patents and patent applications are representative, and other methods of fabrication and materials within the purview of one of ordinary skill in the art are also contemplated.

As is known, aluminum and gallium belong to the same group on the periodic table, with Al belonging to 3rd period, and Ga belonging to 4th period. As such, Al has a smaller ion radius than Ga. While the values of the ion radius differ by documents, in one example, Al has an ion radius of 50 pm (picometers) and Ga 62 pm. In $Ga_{1-x}R_xN$, only Yb having the smallest ion radius among the R elements belonging to the 6th period is substituted by a part of Ga to give an increased electromechanical coupling coefficient. Therefore, it is natural to think that it is unlikely to obtain an increased electromechanical coupling coefficient by substituting a part of Al in the aluminum nitride crystal, which has a smaller ion radius than Ga, by an R element belonging to the 6th period, including a case when the R element is Yb. However, it is found by the present inventors that a piezoelectric layer in which a part of Al in AlN is substituted by Yb can be prepared, to complete the present invention.

In accordance with the present teachings, a piezoelectric layer comprises aluminum ytterbium (Yb) nitride, with the Yb doping elements replacing only Al atoms in the AlN crystal. In accordance with the present teachings, the piezoelectric layer has a chemical composition formula $Al_{1-x}Yb_xN$, wherein the value of x is greater than or equal to 0.10, and less than or equal to 0.27. As such, in accordance with the present teachings, a piezoelectric layer of a representative embodiment having the chemical composition formula $Al_{1-x}Yb_xN$ has greater than or equal to 10% and less than or equal to 27% of Al in AlN that substituted by Yb. Notably, when the percentages of doping element Yb in a doped AlN layer are discussed herein, it is in reference to the only the ratio of Aluminum to Ytterbium of the YbAlN piezoelectric layer. So, for example, if the Yb in the piezoelectric layer of a representative embodiment has an atomic percentage of approximately 12.0%, and the Al has an atomic percentage of approximately 88.0%, then the atomic consistency of the piezoelectric layer may then be represented as $Al_{0.88}Sc_{0.12}N$. As the atomic mass of Yb (173.0) is larger than that of Sc (44.96), which has been used as a dopant in AlN in certain known devices, the piezoelectric layer of the present teachings can increase the electromechanical coupling coefficient more than the piezoelectric layer of certain scandium-doped aluminum nitride (ASN) piezoelectric material, and, thereby widen a usable frequency bandwidth. In addition, in the case of setting the usable frequency bandwidth to the same level, the amount of Yb added according to the present teachings is less than the amount of Sc added in the piezoelectric layer of the known layer ASN layer, thereby reducing the amount of a rare rare-earth element to be used.

Notably, the value of x in the chemical composition formula $Al_{1-x}Yb_xN$ is represented by being rounded off to the second decimal place. To this end, Applicants have determined from evaluation of the composition of each of the obtained piezoelectric layers (Example and Comparative Example) by use of an EPMA (Electron Probe Micro Analyzer, manufactured by JEOL Ltd.), that in a representative embodiment, the piezoelectric layers formed of $Al_{1-x}Yb_xN$ and all having the value of x in the range of 0.0977 to 0.2657 (i.e., 0.10<x<0.27 when rounded off to the second decimal place) were obtained. The values of x of the obtained piezoelectric layers (including x=0 of the comparative example) are shown by the values of the horizontal axis on the 14 measurement points in the graphs of FIG. 3 and FIG. 4, which are described below (i.e., values of the vertical axis of these graphs are described below).

Furthermore, the Applicants have determined that when the value of x in an $Al_{1-x}Yb_xN$ layer is less than 0.10, substantially no significant difference is found in the values of electromechanical coupling coefficients between the layer and an AlN film. Meanwhile, when the value of x exceeds 0.27, it is exceedingly difficult to fabricate a layer of $Al_{1-x}Yb_xN$. Therefore, the present teachings specify that the value of x is 0.10 or more and 0.27 or less in the chemical composition formula $Al_{1-x}Yb_xN$.

$Al_{1-x}Yb_xN$ has a hexagonal crystal structure called wurtzite-type structure as shown in FIG. 1, and has piezoelectricity due to an electric polarization (P) axis in a direction parallel to the c-axis. As described more fully below in connection with the description of FIG. 7, the $Al_{1-x}Yb_xN$ piezoelectric layer of a representative embodiment can be prepared by a sputtering method. Under a nitrogen gas (which may also be a mixed gas of nitrogen gas and another suitable inert gas) atmosphere, by generating sputtering particles of Al and Yb in the vicinity of a substrate to form a $Al_{1-x}Yb_xN$ piezoelectric layer having a defined c-axis is formed. In a representative embodiment, the c-axis of the $Al_{1-x}Yb_xN$ piezoelectric layer is oriented in a direction vertical (orthogonal) to the piezoelectric layer. Stated somewhat differently, and as described more fully below, the $Al_{1-x}Yb_xN$ piezoelectric layer of a representative embodiment has a c-axis orthogonal to a plane of the piezoelectric layer. Alternatively, in accordance with another representative embodiment described below, an $Al_{1-x}Yb_xN$ piezoelectric layer having its c-axis oriented in a direction parallel to a plane of the $Al_{1-x}Yb_xN$ piezoelectric layer is fabricated by irradiating an ion beam comprising of argon, and nitrogen, to a substrate surface at an angle almost parallel to the substrate surface by a sputtering method. Still alternatively, in accordance with another representative embodiment described below, an $Al_{1-x}Yb_xN$ piezoelectric layer having its c-axis in a direction inclined (i.e., neither vertical nor parallel to the piezoelectric layer) to the plane of the $Al_{1-x}Yb_xN$ piezoelectric layer is formed on a substrate by irradiating an ion beam at an angle inclined to a substrate surface is fabricated on the substrate surface by a sputtering method.

A piezoelectric element of a representative embodiment converts an AC electric signal input from a pair of electrodes to mechanical vibrations, and outputs the mechanical vibrations from a surface of a piezoelectric layer to a surrounding medium. Alternately, the piezoelectric element converts, to an AC electric signal, mechanical vibrations input from the surrounding medium to the surface of the piezoelectric layer, and outputs an electric signal from the electrodes.

In accordance with a representative embodiment, an apparatus comprises a substrate; a first electrode disposed over the substrate; a piezoelectric layer disposed over the first electrode. The BAW resonator also comprises a second electrode disposed over the piezoelectric layer. The piezoelectric layer of the apparatus comprises aluminum nitride (AlN) doped with ytterbium (Yb), and an atomic percentage of Yb in the AlN is greater than or equal to approximately 10.0% and less than or equal to approximately 27.0%. Illustratively, in the presently described apparatus, the piezoelectric layer, and the first and second electrodes are disposed in parallel planes, with a c-axis of the $Al_{1-x}Yb_xN$ piezoelectric layer that is orthogonal to each of these planes. Accordingly, in an apparatus of a representative embodiment, the c-axis of $Al_{1-x}Yb_xN$ in a piezoelectric layer is oriented in a direction vertical to the piezoelectric layer. Such an apparatus supports bulk acoustic waves (BAWs), and provides a BAW resonator. A plurality of BAW resonators may be configured to provide an electrical filter.

In the apparatus of a representative embodiment described above, when the c-axis of $Al_{1-x}Yb_xN$ in a piezoelectric layer is oriented in a direction vertical (orthogonal) to the piezoelectric layer, the piezoelectric element can be used as a BAW resonator. By contrast, when the c-axis of a piezoelectric layer is oriented in a direction parallel to the piezoelectric layer (i.e., parallel to a plane of the piezoelectric layer), the piezoelectric layer of the present teaching can be used as a liquid sensor with liquids as the detection object, because due to a shear bulk wave being excited in a piezoelectric layer in the presence of a liquid in the surroundings, the piezoelectric layer resonates without vibrations being leaked to the liquid. Such liquid sensors include, for example, a sensor for detecting an antigen and antibody reaction. An antibody is formed on a surface of a piezoelectric element (on a surface of an electrode, or a surface of a part of a piezoelectric layer not covered by the electrode); when a liquid containing an antigen is brought into contact with the surface, a change in the mass as a result of a coupling between the antigen and the antibody changes a resonance frequency; and by measuring the resonance frequency, the antigen and antibody reaction can be detected by this sensor. In addition, when the c-axis is oriented in a direction inclined to the layer, a longitudinal wave and a shear wave are both excited. Therefore, the piezoelectric element can be used as a piezoelectric element using both the longitudinal wave and the shear wave.

In yet another representative embodiment, a piezoelectric layer is disposed over a first electrode. The piezoelectric layer comprises aluminum nitride (AlN) doped with ytterbium (Yb). An atomic percentage of Yb in the AlN is greater than or equal to approximately 10.0% and less than or equal to approximately 27.0%; and a pair of interdigitated comb electrodes. The apparatus of this representative embodiment is configured to support surface acoustic waves (SAWs), and provides a SAW resonator. A plurality of SAW resonators can be configured to provide a SAW filter.

The piezoelectric element of the second representative embodiment converts an alternating current (AC) electric signal input from a pair of comb electrodes to mechanical vibrations, and generates the mechanical vibrations (a surface acoustic wave) from a surface of a piezoelectric layer to a surrounding medium. Alternately, the piezoelectric element of the representative embodiment converts mechanical vibrations input from the surrounding medium to the surface of the piezoelectric layer to an AC electric signal, and outputs an electric signal from the comb electrodes. A plurality of SAW resonators comprising the piezoelectric layer of the present teachings can be configured to provide a SAW filter.

When the c-axis of a piezoelectric layer is oriented in a direction vertical to the piezoelectric layer, the piezoelectric element of the second embodiment generates a surface acoustic wave called Rayleigh wave, and can be used as a SAW filter. Similarly, when the c-axis of a piezoelectric layer is oriented parallel to the piezoelectric layer and vertical to an extending direction of the comb teeth, the piezoelectric element can be used as a SAW filter. In addition, when the c-axis of a piezoelectric layer is oriented parallel to the piezoelectric layer and parallel to an extending direction of the comb teeth, the piezoelectric element generates a transversal wave-type surface acoustic wave, and can not only be used as a SAW filter, but also as a liquid sensor. This liquid sensor uses a change in the speed of a surface wave by the size of an electric conductivity of a liquid in the vicinity of an object (solid object), thereby being able to measure the electric conductivity of the liquid. When the c-axis of a piezoelectric layer is oriented in a direction inclined to the layer, the piezoelectric element can be used as a device using both the longitudinal wave (Rayleigh wave) and the shear wave.

With reference to FIG. 2 to FIG. 9, representative embodiments of piezoelectric layers, and methods and apparatuses for fabricating the piezoelectric layers of the present teachings are described. The following representative embodiments are for illustrating some of the illustrative examples of the present teachings, and do not limit the present invention.

Figure 2:
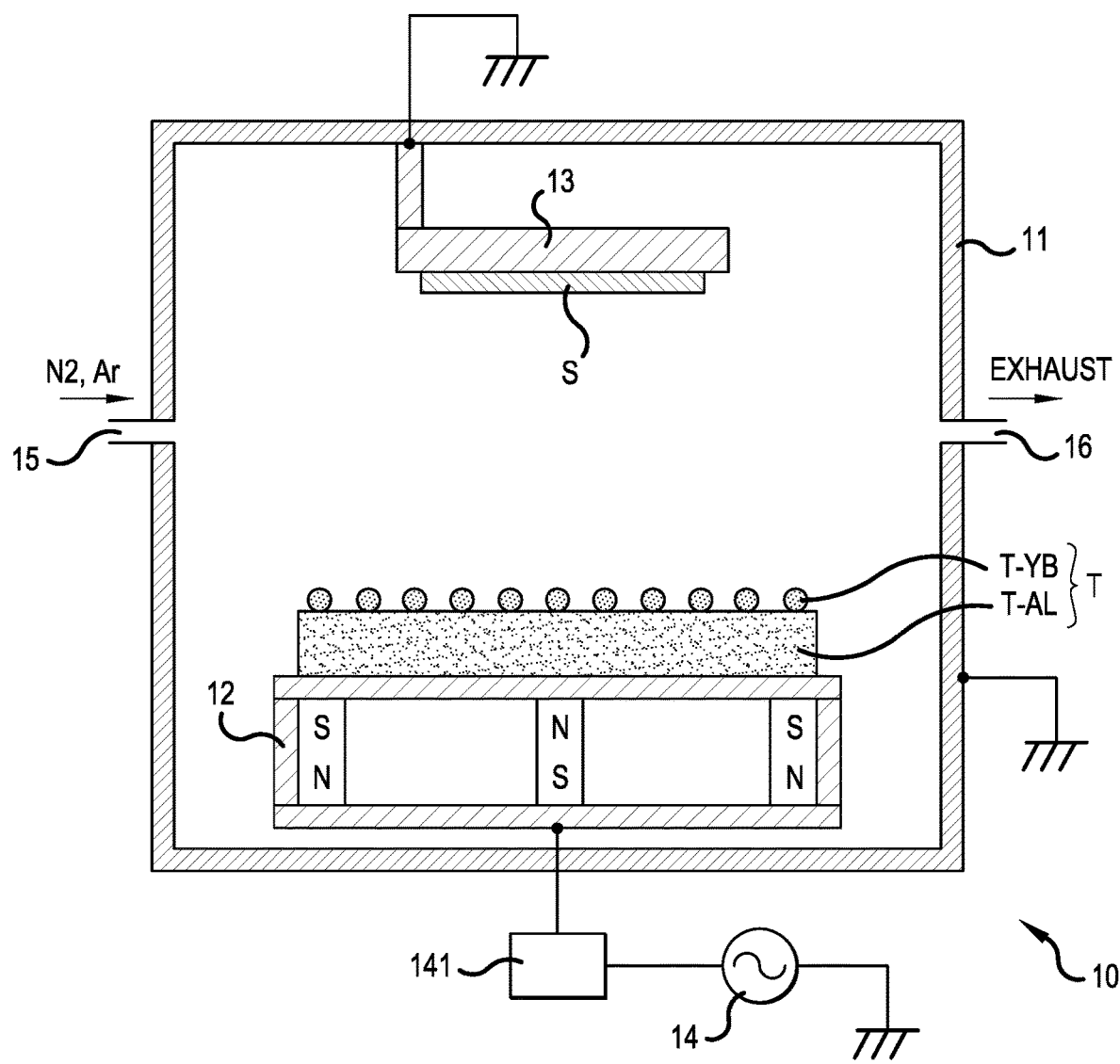
FIG. 2 is a simplified schematic view of an apparatus of a representative embodiment used to form a piezoelectric layer of the present teachings.

FIG. 2 is a simplified schematic view of sputtering device used to form a piezoelectric layer in accordance with a representative embodiment. The sputtering device 10 comprises in a vacuum chamber 11, a magnetron cathode 12; and a anode 13, which is plate-like, disposed to face the magnetron cathode 12. The magnetron cathode 12 has a sputtering target T disposed on a surface facing an anode 13, and is connected to a high frequency power supply 14 via a matching box 141. The anode 13 has a substrate S attached to a surface facing the magnetron cathode 12, and is grounded. A wall surface of the vacuum chamber 11 comprises a gas introduction port 15 for introducing gas to the inside of the vacuum chamber 11; and a gas exhaust port 16 for discharging air and the like from inside the vacuum chamber 11 before introducing the gas. Notably, although not essential, the anode 13 may have a water cooling type cooling device (not shown) for cooling the substrate S.

As will become clearer as the present description continues, the substrate S is selected for use as a platform for subsequent devices (e.g., acoustic resonators) and the components thereof (e.g., electrodes). In accordance with a representative embodiment, the substrate comprises single-crystal silicon (Si), or similar material.

In the presently described representative embodiment, the sputtering target T comprises a granular target of ytterbium (T-YB) disposed over a plate-like aluminum target (T-AL). Alternatively, rather than sputtering targets T-AL and T-YB, a plate-like target formed of an alloy of Al and Yb may also be used. Still alternatively, a binary sputtering method, in which one target comprising Al and another target comprising of Yb are placed on different sputtering sources, may also be used.

After the selected sputtering target set-up is made, a high frequency power supply 14 provides electrical power having an illustrative frequency of 13.56 MHz at a power level of approximately 40 W to approximately 150 W. For gas introduced from the gas introduction port 15 to the inside of the vacuum chamber 11, the present embodiment uses mixed gas of nitrogen gas and argon gas, with a mixing ratio of nitrogen gas to argon gas being approximately 1:2 in partial pressure. The pressure of the entire mixed gas is set to approximately 0.75 Pa. It is emphasized that this mixing ratio and pressure are merely illustrative, and are not intended to be limited to this example. In addition, another inert gas may also be used instead of argon gas, and only nitrogen gas may be used instead of mixed gas.

Next, an Example, in which piezoelectric layers of the present embodiment were prepared under the above condition using the sputtering device 10, is explained. In the Example, the amount of the target T-YB was changed to obtain ten different layers of $Al_{1-x}Yb_xN$, having different atomic percentages of Al and Yb. As a Comparative Example, an undoped AlN layer was prepared without placing the target T-YB on the target T-Al (i.e., just using T-Al).

As a result of evaluation of the composition of each of the obtained piezoelectric layers (Example and Comparative Example) by an EPMA (Electron Probe Micro Analyzer, manufactured by JEOL Ltd.), it was confirmed that in the Example, piezoelectric layers formed of $Al_{1-x}Yb_xN$ and all having the value of x in the range of 0.0977 to 0.2657 (where $0.10 > x < 0.27$ when rounded off to the second decimal place) were obtained. The values of x of the obtained piezoelectric layers (including x=0 of the comparative example) are shown by the values of the horizontal axis on the 14 measurement points in the graphs of FIG. 3 and FIG. 4 (values of the vertical axis of these graphs are described below).

Figure 3:
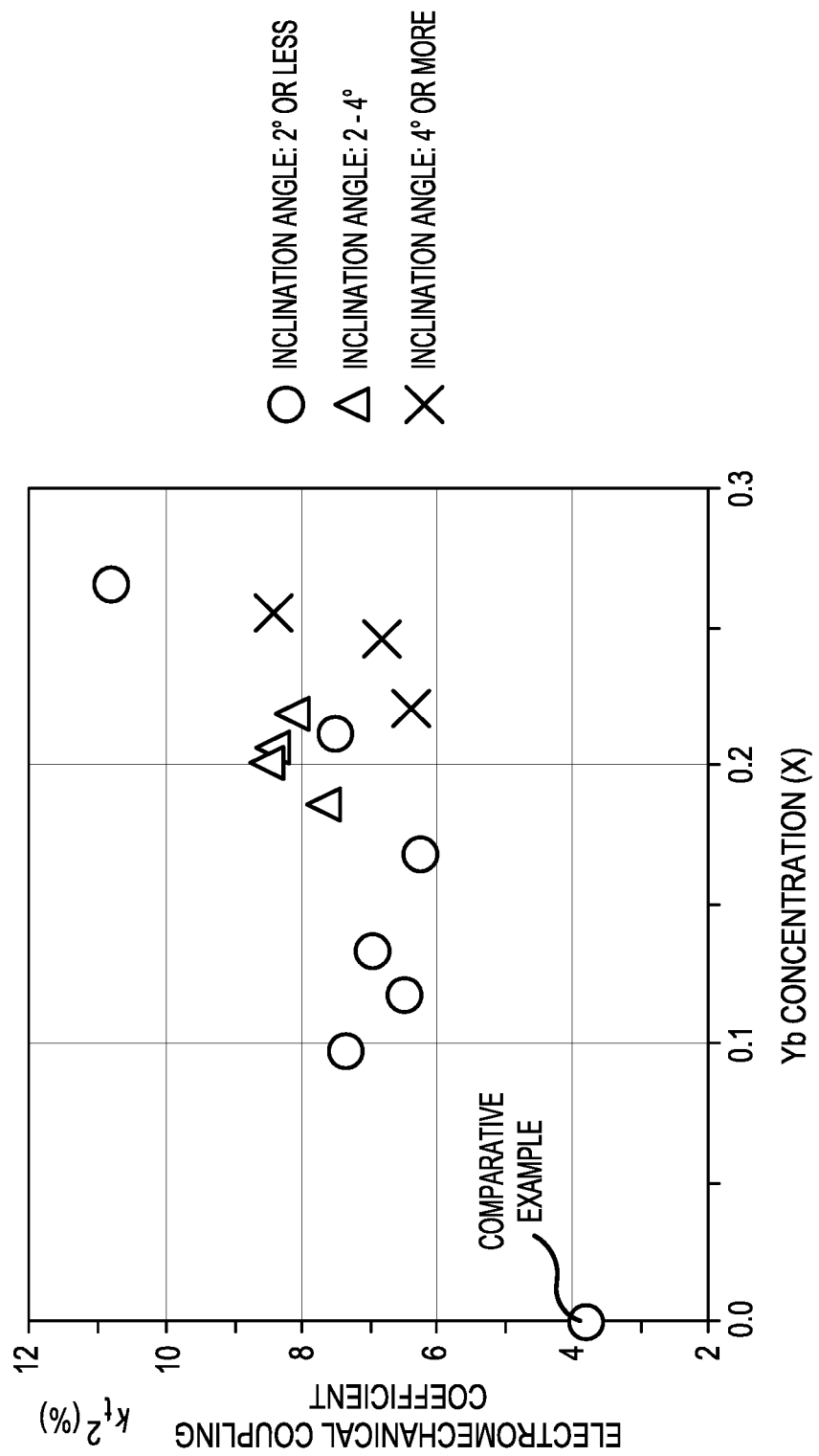
FIG. 3 is graph showing a relationship between ytterbium (Yb) concentrations and electromechanical coupling coefficients in the Example of piezoelectric layers of the present teachings, together with inclination angles of the c-axis in a direction vertical to the layer, which are obtained by X-ray diffraction
Figure 4:
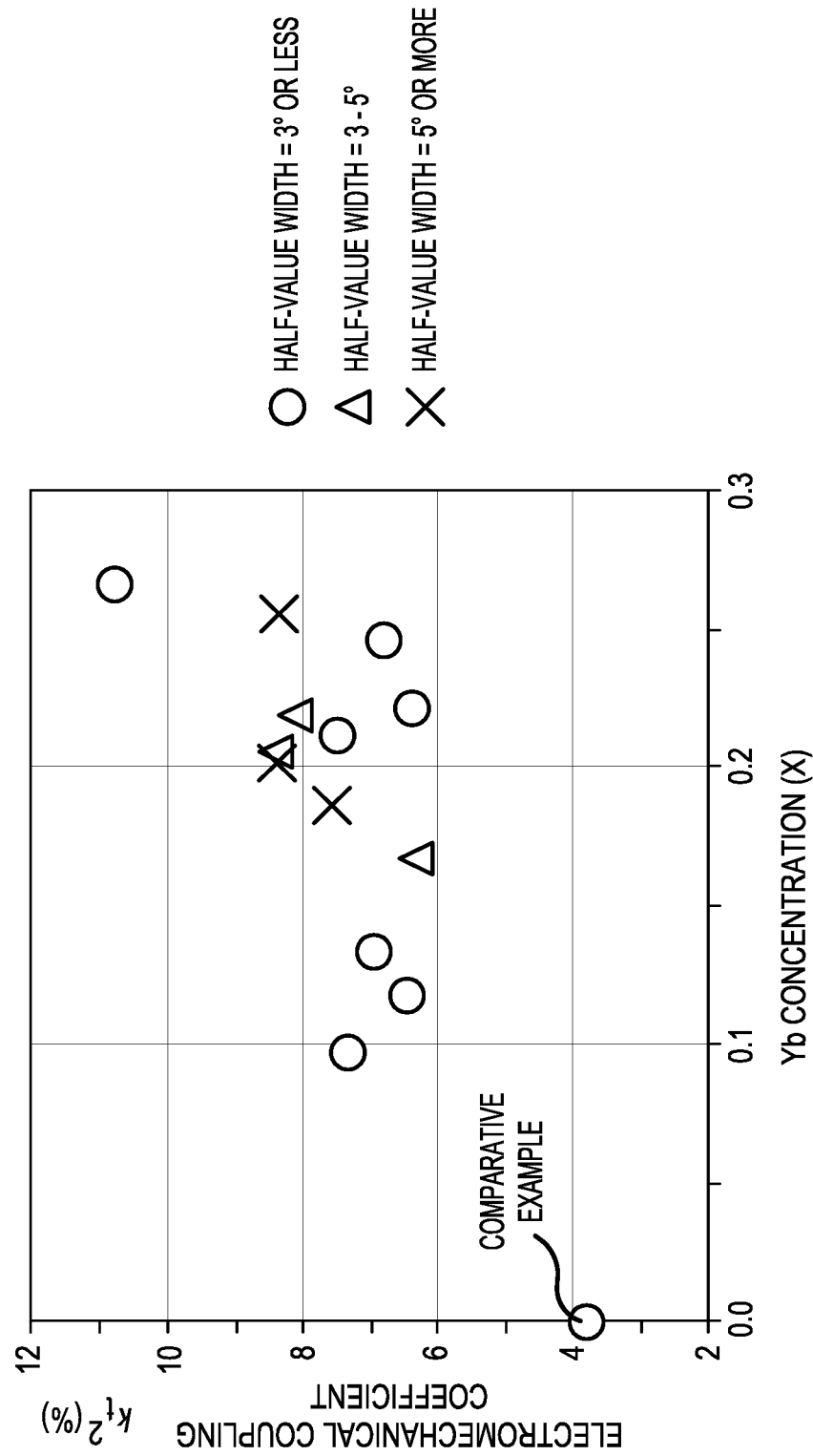
FIG. 4 is a graph showing a relationship between Yb concentrations and electromechanical coupling coefficients in piezoelectric layers of the Example of the present teachings, together with rocking curve half-value widths obtained by X-ray diffraction.

Next, each of the obtained piezoelectric layers was evaluated by X-ray diffraction method. The c-axis had an inclination angle of 0° to 8.1° against a direction vertical to a plane in which an upper surface the piezoelectric layer is disposed (i.e., 0° to 8.1° relative to, for example, the z-axis of FIG. 8). In the graph of FIG. 3, the inclination angles of the c-axis of the piezoelectric layers are shown into 3 types: 2° or less (circle), between 2° and 4° (triangle), and 4° or more (maximum 8.1°, x), again with all angular measurements being relative to the vertical or orthogonal axis to a plane in which the upper surface of the piezoelectric layer is disposed (again, relative to, for example, the z-axis of FIG. 8). In addition, half-value widths, which are values showing variations in the c-axis direction, were between 1.4° and 5.4°. In the graph of FIG. 4, the half-value widths of the piezoelectric layers are shown into 3 types: 3° or less (circle), between 3° and 5° (triangle), and 5° or more (maximum 5.4°, x) relative to a plane in which the upper surface of the piezoelectric layer is disposed (again, relative to, for example, the z-axis of FIG. 8). From the above results, it may be evaluated that all the piezoelectric layers are oriented in a direction vertical to the c-axis.

Figure 5:
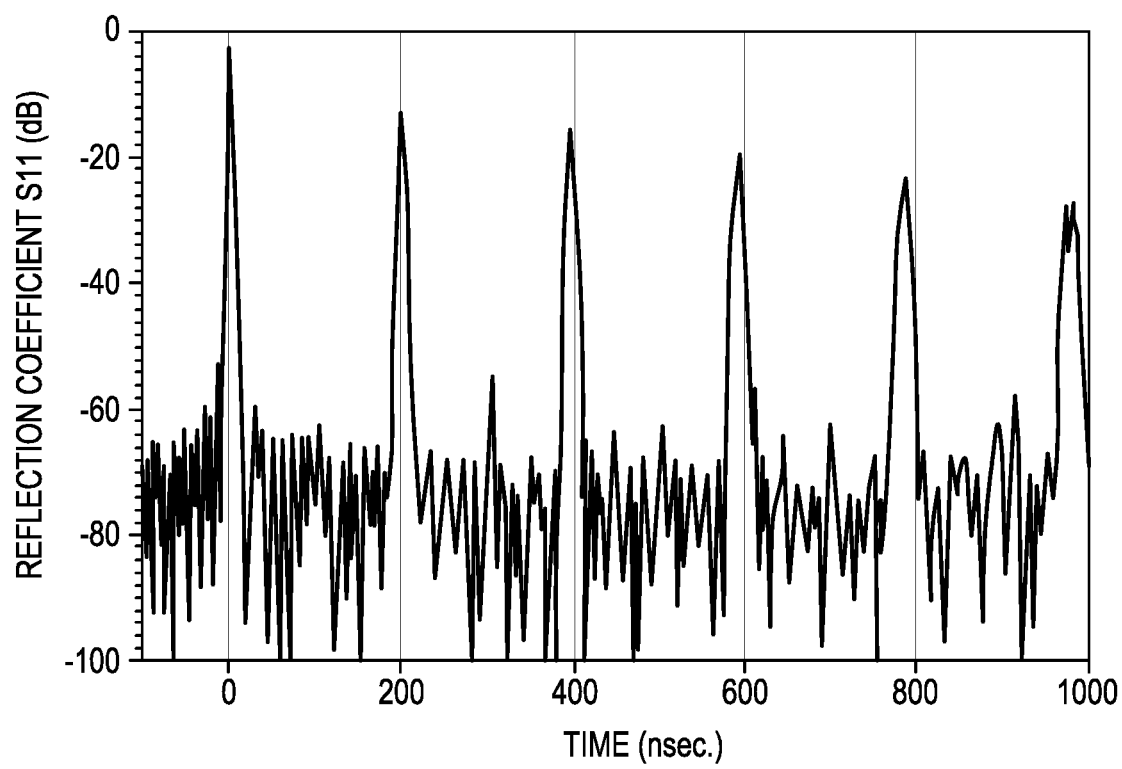
FIG. 5 is graph showing a time waveform of impulse response obtained by inverse-Fourier transforming the frequency characteristic of a reflection coefficient in accordance with a representative embodiment.
Figure 6:
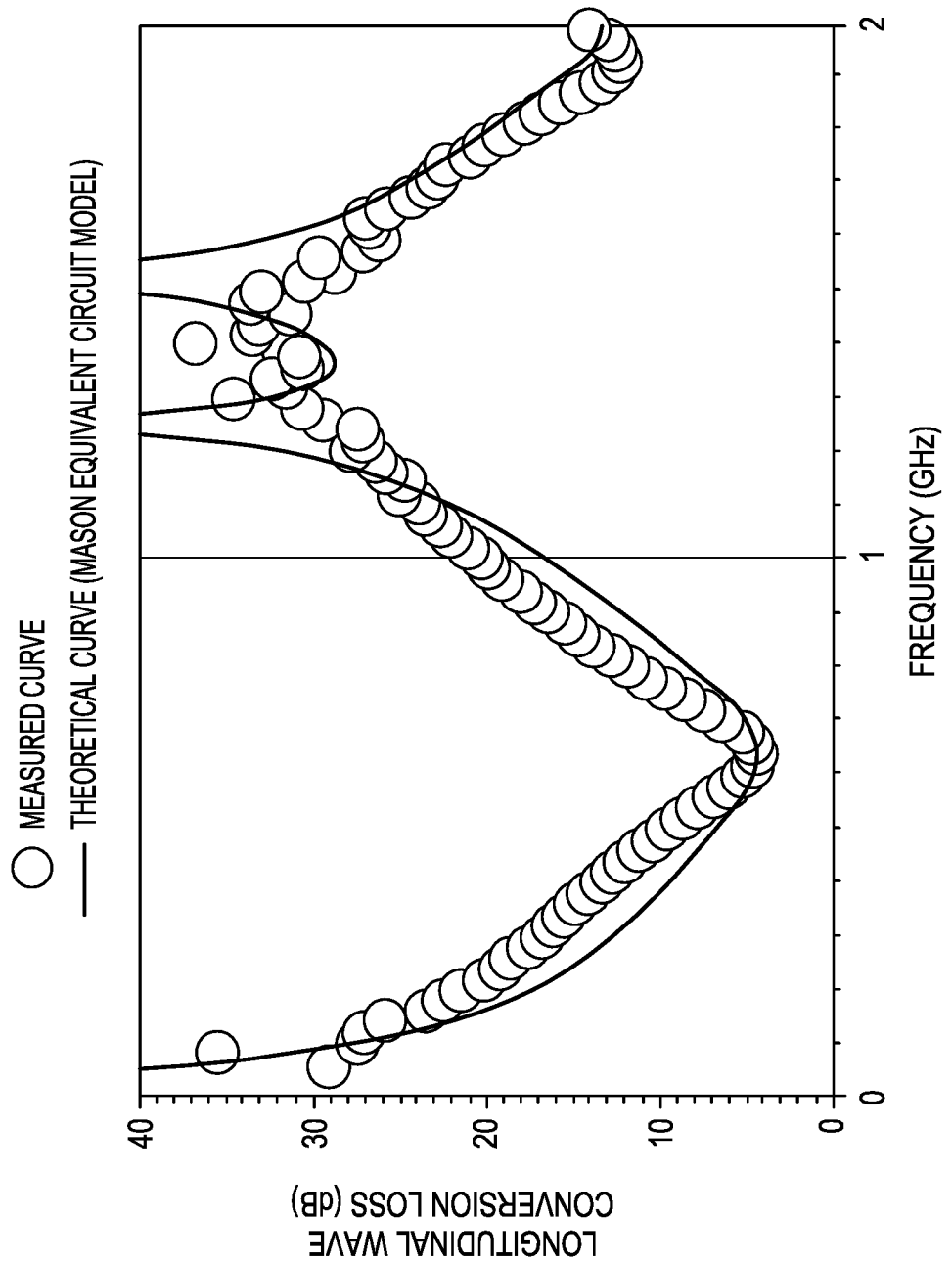
FIG. 6 is graph showing the frequency characteristic (circle) of a longitudinal wave conversion loss obtained by Fourier transforming a first reflection wave of the time waveform shown in FIG. 5, and a theoretical curve (solid line) of the frequency characteristic calculated based on Mason equivalent circuit model.

Next, an experiment of obtaining electromechanical coupling coefficients was conducted in order to evaluate the piezoelectric characteristic of the obtained piezoelectric layers. In this experiment, a HBAR (high-overtone bulk acoustic resonator) in which, on a quartz glass substrate, a lower electrode made of Ti, an $Al_{1-x}Yb_xN$ layer of the Example, and an upper electrode made of Au were deposited in this order from the bottom, was prepared, and electromechanical coupling coefficients were obtained from the result of measurement of longitudinal wave conversion losses using a network analyzer (E5071C, Agilent Technologies). Specifically, first, the frequency characteristic of a reflection coefficient S11 of the prepared HBAR was measured; the frequency characteristic of the reflection coefficient S11 was inverse-Fourier transformed to obtain an impulse response time waveform (FIG. 5); and only the echo of a first wave observed in the vicinity of 200 nsec of the impulse response time waveform was extracted and Fourier-transformed, thereby obtaining the frequency characteristic (FIG. 6) of a longitudinal wave conversion loss. In FIG. 5 and FIG. 6, exemplary impulse response time waveform and frequency characteristic of longitudinal wave conversion loss are shown for a sample having x=0.17. By comparing the measured value of the thus-obtained longitudinal wave conversion loss and the theoretical curve, the electromechanical coupling coefficient value was estimated.

In this experiment, as the entirety of the piezoelectric layer is in contact with the quartz glass substrate via the lower electrode, a diffraction loss and a propagation attenuation occur when a sound wave excited in the piezoelectric layer propagates through the quartz glass substrate. Therefore, the electromechanical coupling coefficient value obtained by the above method is smaller than those obtained by other methods. Thus, in the following, the electromechanical coupling coefficient values of the $Al_{1-x}Yb_xN$ layers of the Example are not compared with electromechanical coupling coefficient values reported in other documents, but with that of the AlN layer without Yb prepared in the Comparative Example.

The electromechanical coupling coefficient ($kt^2$) values fabricated according to the representative embodiments above, and obtained in the above experiment are shown in FIG. 3 and FIG. 4 (FIG. 3 and FIG. 4 only differ by way of presenting the above result of the X-ray diffraction, and the electromechanical coupling coefficients have the same values). While the electromechanical coefficient ($kt^2$) value is around 3.8% in the Comparative Example, $kt^2$ ranges from approximately 6.2% to approximately 10.8% in the Example, which are as large as approximately 1.6 times to approximately 2.8 times the $kt^2$ of the piezoelectric layer of the Comparative Example. This means that (although the measurement method is different) they are equivalent to or more than the maximum value (1.8 times) of the ratio of the electromechanical coupling coefficient of a known $Al_{1-x}Sc_xN$ layer to that of the comparative example (undoped AlN layer). That is, the $Al_{1-x}Yb_xN$ layers of the representative embodiment of the Example have electromechanical coupling coefficients equivalent to or more than that of a known $Al_{1-x}Sc_xN$ layer.

Further, using the known $Al_{1-x}Sc_xN$ layer formed in a similar manner as the Example, an experiment of obtaining an electromechanical coupling coefficient using a HBAR is also conducted. However, when a Sc content x is 0.38, the electromechanical coupling coefficient obtained in the experiment is 10.0%, which is smaller than the maximum value of the Example. Then, it is not until x is 0.40 in $Al_{1-x}Sc_xN$ that the electromechanical coupling coefficient becomes larger than the maximum value of the Example. As the maximum value in the Example is obtained when a Yb content x is 0.21, it can be said that electromechanical coupling coefficients of about the same level can be obtained by the $Al_{1-x}Yb_xN$ layers of the Example with less amount of rare earth (Yb) than by the known $Al_{1-x}Sc_xN$ layer.

Figure 7:
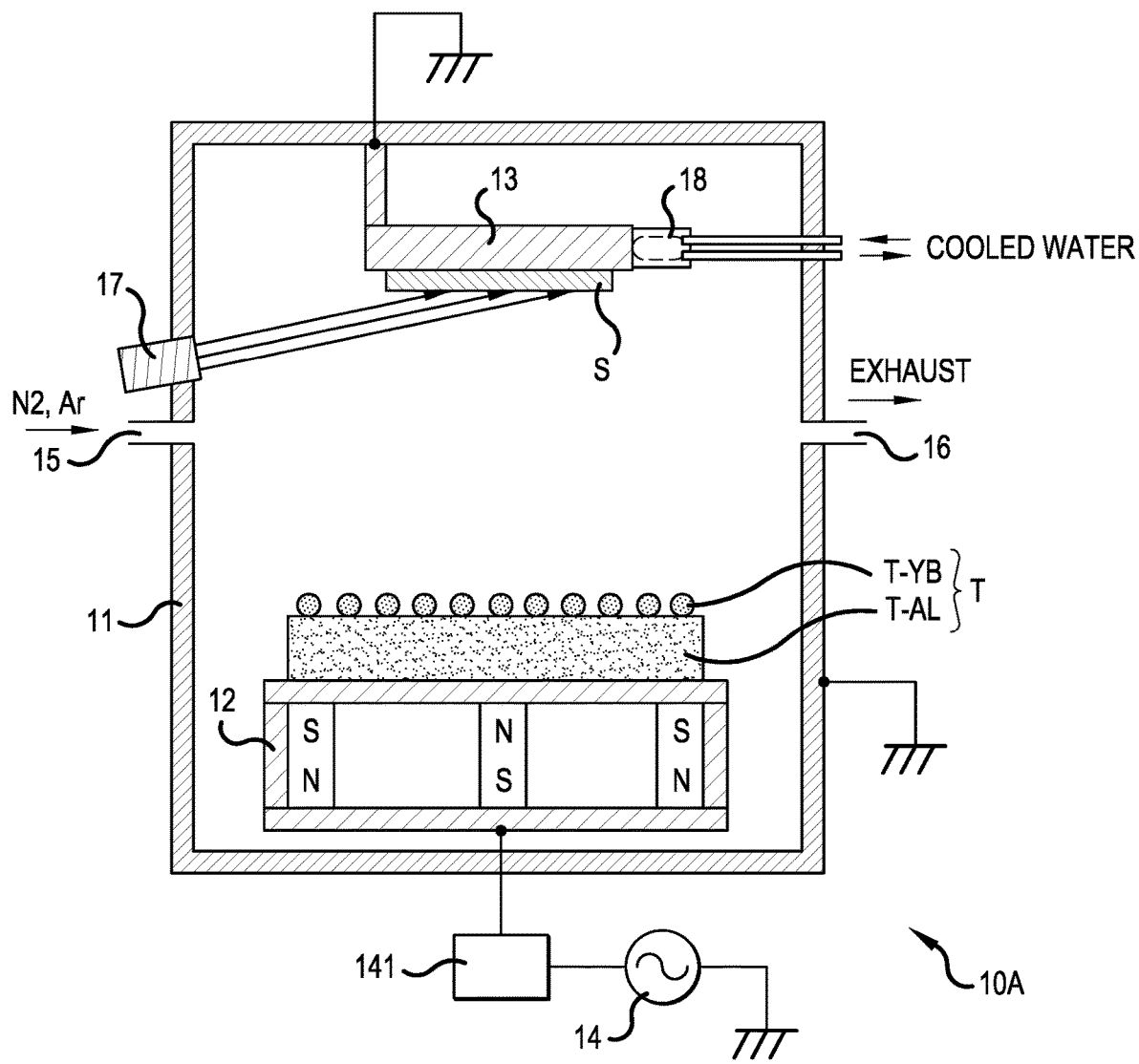
FIG. 7 is a schematic view of another of apparatus of a representative embodiment for producing a piezoelectric layer of the present teachings.

FIG. 7 shows a sputtering device 10A in accordance with another representative embodiment. Many of the details of the sputtering device 10A, its components, and its operation are similar to those of the sputtering device 10 described in connection with FIG. 2, and may not be repeated in the interest of clarity of description.

Figure 8:
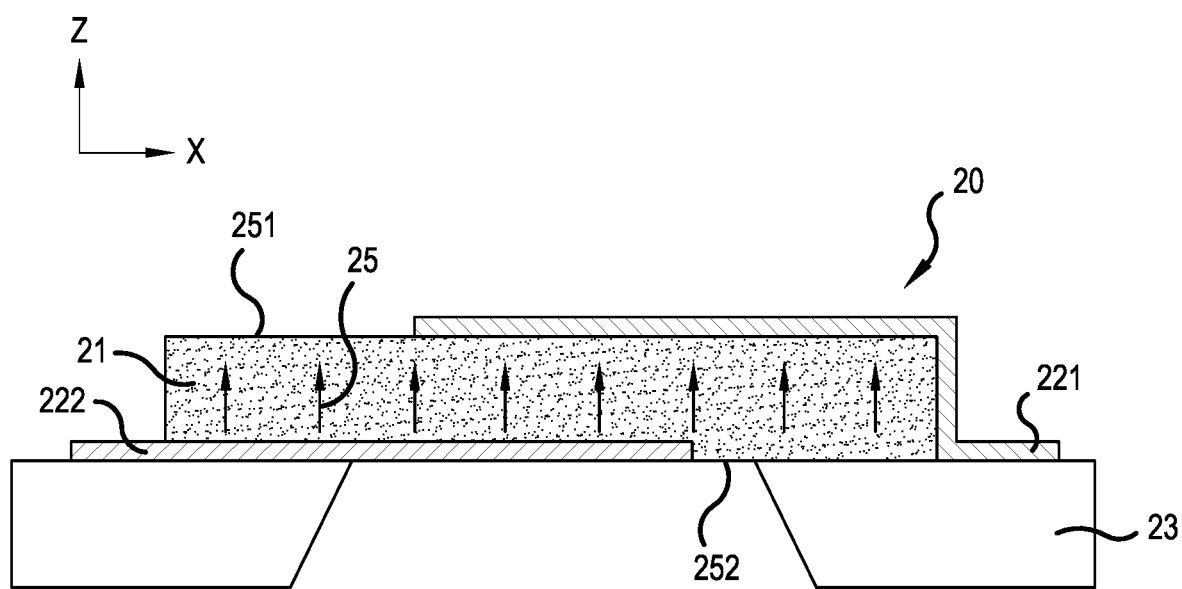
FIG. 8 is a cross-sectional view of a bulk acoustic wave (BAW) resonator of a representative embodiment comprising a piezoelectric layer of the present teachings.
Figure 9:
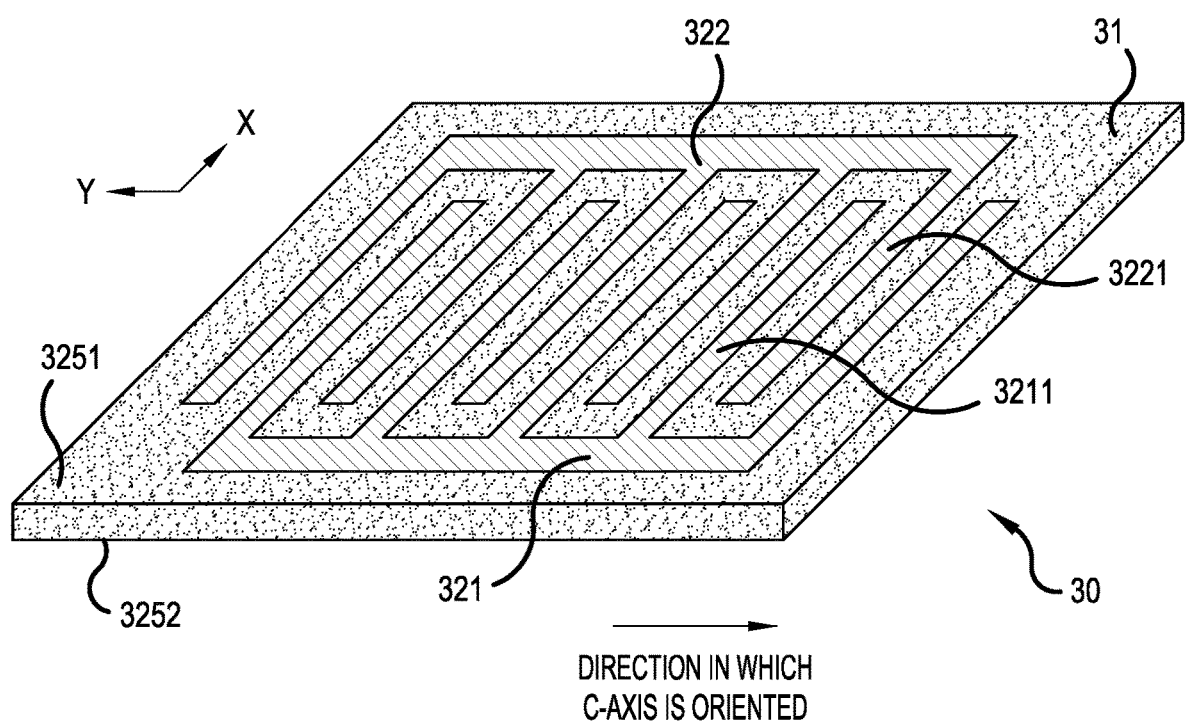
FIG. 9 is a perspective view showing a surface acoustic wave (SAW) resonator of a representative embodiment comprising a piezoelectric layer of the present teachings.

The sputtering device 10A is a device for preparing an $Al_{1-x}Yb_xN$ layer in which the c-axis of the piezoelectric layer is oriented in a direction parallel to the plane of the piezoelectric layer (e.g., in the x-y plane of the respective upper surfaces of the $Al_{1-x}Yb_xN$ layers of FIGS. 8 and 9). Comparison between this sputtering device 10A and the above sputtering device 10 shows that this sputtering device differs in that it has: an ion beam irradiation device 17 for irradiating ion beams to a surface of a substrate S attached to an anode 13; and a cooling device 18 for cooling the substrate S via the anode 13. The ion beam irradiation device 17 irradiates argon and nitrogen ion beams, at an angle almost parallel to a surface of the substrate S, to the surface. By depositing sputtering particles on the surface of the substrate S while using the ion beam irradiation device 17 to irradiate argon ion beams to the surface at the above angle, an $Al_{1-x}Yb_xN$ layer in which the c-axis is oriented in a direction parallel to the Al1-xYbxN layer is realized. When the angle of the ion beams against the surface of the substrate S is increased, an Al1-xYbxN layer in which the c-axis is oriented in a direction inclined to the layer can be obtained. In the present variation, the cooling device 18 is of water-cooling type, but a cooling device of another method may also be used as long as the substrate S can be cooled.

FIG. 8 is a cross-sectional view of a bulk acoustic wave (BAW) resonator 20 of a representative embodiment comprising a piezoelectric layer of the present teachings. Generally, a BAW resonator disposed over an acoustic reflector comprising a cavity (see below) is referred to as a film bulk acoustic resonator (FBAR), whereas a BAW resonator disposed over an acoustic reflector comprising alternating low acoustic impedance and high acoustic impedance layers (often referred to as a distributed Bragg reflector) is referred to as a solid-mount resonator (SMR).

The BAW resonator 20 comprises a cavity 231 disposed beneath the acoustic stack comprising a lower electrode 222, a piezoelectric layer 21, comprising an $Al_{1-x}Yb_xN$ layer (0.10<x<0.27 when rounded off to the second decimal place) disposed over an upper surface of the lower electrode, and an upper electrode 221 disposed on an upper surface of the piezoelectric layer 21. The cavity 231 is formed in a substrate 23, which as described above, may be monocrystalline silicon, or other suitable material. As such, the BAW resonator 20 is an FBAR.

The piezoelectric layer 21 has an upper surface 251 disposed in first plane (in the x-y dimension of the coordinate system depicted in FIG. 8), and a lower surface 252 disposed in a second plane (in the x-y dimension of the coordinate system depicted in FIG. 8), which is parallel to the first plane. The piezoelectric layer 21 has a c-axis (and thus polarization axis) oriented in a direction that is substantially vertical (see arrows 22) to the piezoelectric layer 21 (i.e., the c-axis is oriented in the z-direction of the coordinate system shown), and as such the c-axis is oriented substantially perpendicular to first plane (i.e., in the x-y plane of the coordinate system shown) of the upper surface 251 of the piezoelectric layer 21 (c-axis is substantially parallel to the z-axis). The piezoelectric layer 21 being sandwiched between the upper electrode 221 and the lower electrode 222 functions as a layer resonator, and only a part thereof is supported by the substrate 23, while the remaining portion is over the cavity 231 of the substrate 23. In the FBAR 20, when an AC voltage is applied between the upper electrode 221 and the lower electrode 222, the piezoelectric layer 21 vibrates in a substantially vertical direction (parallel to the z-axis in the coordinate system depicted) to the piezoelectric layer 21, and beneficially launches longitudinal modes. Meanwhile, when vibrations are applied in a direction vertical to the piezoelectric layer 21, an AC voltage is generated between the upper electrode 221 and the lower electrode 222.

The direction of the c-axis of the piezoelectric layer 21 in the FBAR 20 is not limited by the above example, and may be in a direction parallel to the piezoelectric layer 21, or in a direction inclined (neither vertical nor parallel to the piezoelectric layer 21) to the piezoelectric layer 21. When the c-axis is not vertical to the piezoelectric layer 21 as the above, the FBAR 20 can be used as a layer resonator sensor. Further, by having the same configuration as that of the FBAR 20, the piezoelectric element can be used as a piezoelectric element other than a layer resonator, such as a piezoelectric actuator.

FIG. 9 is a perspective view showing a surface acoustic wave (SAW) resonator 30 of a representative embodiment comprising a piezoelectric layer 31 of the present teachings. The piezoelectric layer 31 has an upper surface 3251 disposed in first plane (in the x-y dimension of the coordinate system depicted in FIG. 9), and a lower surface 3252 disposed in a second plane (in the x-y dimension of the coordinate system depicted in FIG. 9), which is parallel to the first plane.

The SAW 30 resonator comprises: a piezoelectric layer 31, comprising an $Al_{1-x}Yb_xN$ layer (0.10<x<0.27 when rounded off to the second decimal place); a first comb electrode 321; and a second comb electrode 322 disposed over an upper surface of the piezoelectric layer 31. The first comb electrode 321 has a plurality of comb teeth 3221 disposed in a plane (xy plane of the coordinate system shown in FIG. 9) of the upper surface of the piezoelectric layer 31 and extending in a direction vertical to the c-axis of the piezoelectric layer 31. The second comb electrode 322 also has similar comb teeth 3222.

The comb teeth 3211 of the first comb electrode 321 and the comb teeth 3222 of the second comb electrode 322 are disposed in an interdigitated arrangement.

In the SAW device 30, when an AC voltage is applied between the first comb electrode 321 and the second comb electrode 322, the piezoelectric layer 31 vibrates in a direction parallel to the c-axis (i.e., anti-parallel to the y-axis in the coordinate axis shown in FIG. 9). Meanwhile, when vibrations are applied to the piezoelectric layer 31 in a direction parallel to the c-axis, an AC voltage is generated between the first comb electrode 321 and the second comb electrode 322.

The direction of the c-axis of the piezoelectric layer 31 in the SAW device 30 is not limited by the above example, and may be parallel to the comb teeth 3221 and 3222, or may be in a direction parallel to the piezoelectric layer 31 instead of both being parallel or vertical to the comb teeth 3221 and 3222 (i.e., parallel/anti-parallel to the x-axis of the coordinate system shown in FIG. 9). Further, it may be in a direction vertical (i.e., parallel to the z-axis of the coordinate system of FIG. 9) to the piezoelectric layer 31, or in a direction inclined (neither vertical nor parallel to the piezoelectric layer 21) to the piezoelectric layer 21. However, when generating a transversal wave-type surface acoustic wave, the c-axis needs to be non-vertical (i.e., not parallel to the z-axis) to the piezoelectric layer 31 and non-parallel to the comb teeth 3221 and 3222 (i.e., not parallel to the x-axis), and it is preferably parallel to the piezoelectric layer 31 (i.e., anti-parallel to the y direction in the coordinate axis shown in FIG. 9) and vertical (parallel to the z-axis in the coordinate system of FIG. 9 (to the comb teeth 3221 and 3222.

The piezoelectric layer of the present invention can be applied to a piezoelectric layer used for an ultrasound transducer, a diaphragm-type aerial ultrasound element (pMUT), a piezoelectric transformer, an energy harvester, a piezoelectric actuator, a piezoelectric motor, an ultrasound probe for medical equipment, and others, in addition to a frequency filter and a sensor using the above-mentioned layer resonator and SAW device.

In accordance with representative embodiments, Yb doped AlN material (AYbN) and layers, BAW and SAW resonators for various applications including AYbN layer, such as in electrical filters and other components of wireless communication devices, are described, and other devices described above are provided. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A piezoelectric layer comprising:
   aluminum nitride (AlN) doped with ytterbium (Yb), an atomic percentage of Yb in the AlN being greater than or equal to approximately 10.0% and less than or equal to approximately 27.0%.

2. The piezoelectric layer according to claim 1, wherein the piezoelectric layer has an upper surface in a first plane, and a lower surface in a second plane opposing the upper surface, the first plane being parallel to the second plane, and the piezoelectric layer comprises a polarization axis (c-axis) oriented orthogonally to the first and second planes.

3. The piezoelectric layer according to claim 1, wherein the piezoelectric layer has a first surface, and a second surface opposing the first surface, the first and second surfaces being disposed in first and second parallel planes, respectively, and the piezoelectric layer comprises a polarization axis (c-axis) that is oriented parallel to the first and second planes.

4. The piezoelectric layer according to claim 1, wherein the piezoelectric layer has an upper surface, and a lower surface opposing the upper surface, the upper and lower surfaces being disposed in first and second parallel planes, respectively, and the piezoelectric layer comprises a polarization axis (c-axis) that is oriented at an angle greater than approximately 0° to the first and second planes, and less than orthogonal to the first and second planes.

5. A bulk acoustic wave (BAW) resonator, comprising:
   a substrate;
   a first electrode disposed over the substrate;
   a piezoelectric layer disposed over the first electrode, the piezoelectric layer comprising aluminum nitride (AlN) doped with ytterbium (Yb), an atomic percentage of Yb in the AlN is greater than or equal to approximately 10.0% and less than or equal to approximately 27.0%; and
   a second electrode disposed over the piezoelectric layer.

6. The BAW resonator as claimed in claim 5, further comprising an acoustic reflector disposed in the substrate, and beneath the first electrode.

7. The BAW resonator as claimed in claim 6, wherein the acoustic reflector is a cavity in the substrate, or a distributed Bragg reflector disposed in the substrate.

8. A BAW resonator filter comprising a plurality of the BAW resonators of claim 7.

9. The BAW resonator filter of claim 8, wherein at least two of the plurality of BAW resonators are electrically connected in series, and at least two of the BAW resonators are connected electrically in parallel.

10. The BAW resonator of claim 5, wherein the piezoelectric layer comprises an upper surface disposed in a first plane and a polarization axis (c-axis) that is substantially perpendicular to the first plane.

11. The BAW resonator of claim 5, wherein the piezoelectric layer comprises an upper surface disposed in a first plane and a polarization axis (c-axis) that is inclined relative to the first plane.

12. The BAW resonator of claim 5, wherein the piezoelectric layer is sandwiched between the first electrode and the second electrode and wherein a portion of an upper surface of the piezoelectric layer is not covered by the second electrode.

13. A surface acoustic wave (SAW) resonator, comprising:
- a piezoelectric layer comprising aluminum nitride (AlN) doped with ytterbium (Yb), an atomic percentage of Yb in the AlN being greater than or equal to approximately 10.0% and less than or equal to approximately 27.0%; and
- a pair of interdigitated comb electrodes disposed over the piezoelectric layer.

14. The SAW resonator of claim 13, wherein the piezoelectric layer comprises a polarization axis (c-axis) oriented orthogonally to an upper surface of the piezoelectric layer.

15. The SAW resonator of claim 14, wherein the pair of interdigitated comb electrodes are disposed in a plane of the upper surface of the piezoelectric layer.

16. The SAW resonator of claim 13, wherein the piezoelectric layer comprises a polarization axis (c-axis) oriented parallel to an upper surface of the piezoelectric layer.

17. The SAW resonator of claim 16, wherein the c-axis is also oriented parallel to the pair of interdigitated comb electrodes.

18. The SAW resonator of claim 13, wherein the pair of interdigitated comb electrodes comprise a first electrode and a second electrode and wherein the pair of interdigitated comb electrodes are configured to vibrate in a direction that is parallel to a polarization axis (c-axis) of the piezoelectric layer in response to having an AC voltage applied between the first electrode and the second electrode.

19. The SAW resonator of claim 13, wherein the pair of interdigitated comb electrodes comprise a first electrode and a second electrode and wherein the pair of interdigitated comb electrodes are configured to produce an AC voltage in response to having vibrations applied to the piezoelectric layer in a direction that is parallel to a polarization axis (c-axis) of the piezoelectric layer.

20. The SAW resonator of claim 13, wherein the piezoelectric layer comprises a polarization axis (c-axis) oriented in a direction inclined relative to the piezoelectric layer.

* * * * *